(12) United States Patent
Kato et al.

(10) Patent No.: US 8,063,445 B2
(45) Date of Patent: Nov. 22, 2011

(54) SEMICONDUCTOR DEVICE AND METHOD OF MANUFACTURING THE SAME

(75) Inventors: Shinjiro Kato, Chiba (JP); Naoto Saito, Chiba (JP)

(73) Assignee: Seiko Instruments Inc. (JP)

( * ) Notice: Subject to any disclaimer, the term of this patent is extended or adjusted under 35 U.S.C. 154(b) by 226 days.

(21) Appl. No.: 12/462,909

(22) Filed: Aug. 11, 2009

(65) Prior Publication Data

US 2010/0044790 A1    Feb. 25, 2010

(30) Foreign Application Priority Data

Aug. 13, 2008  (JP) .................................. 2008-208583
Jul. 10, 2009  (JP) .................................. 2009-164073

(51) Int. Cl.
*H01L 29/76*    (2006.01)
*H01L 29/788*   (2006.01)

(52) U.S. Cl. ........ 257/343; 257/409; 257/484; 438/140; 438/282

(58) Field of Classification Search .................. 257/343, 257/409, 484, E21.552, E21.417; 438/140, 438/282

See application file for complete search history.

(56) References Cited

U.S. PATENT DOCUMENTS 6,096,589 A * 8/2000 Lee et al. ...................... 438/225
7,196,393 B2 * 3/2007 Suzuki et al. ................. 257/502

OTHER PUBLICATIONS

Patent Abstracts of Japan, publication No. 2002-208694, publication date Jul. 26, 2002.

* cited by examiner

*Primary Examiner* — Theresa T Doan
(74) *Attorney, Agent, or Firm* — Adams & Wilks

(57) ABSTRACT

Provided is a semiconductor device which includes a metal oxide semiconductor (MOS) transistor having high driving performance and high withstanding voltage with a thick gate oxide film. In the local oxidation-of-silicon (LOCOS) offset MOS transistor having high withstanding voltage, in order to prevent a gate oxide film (6) formed on a channel formation region (7) from being etched at a time of removing the gate oxide film (6) with a polycrystalline silicon gate electrode (8) being used as a mask to form a second conductivity type high concentration source region (4) and a second conductivity type high concentration drain region (5), a source field oxide film (14) is formed also on a source side of the channel formation region (7), and in addition, a length of a second conductivity type high concentration source field region (13) is optimized. Accordingly, it is possible to obtain a MOS transistor having high driving performance and high withstanding voltage with a thick gate oxide film.

3 Claims, 4 Drawing Sheets

Prior Art

SEMICONDUCTOR DEVICE AND METHOD OF MANUFACTURING THE SAME

BACKGROUND OF THE INVENTION

1. Field of the Invention

The present invention relates to a semiconductor device having high withstanding voltage and high driving performance for a metal oxide semiconductor (MOS) transistor, and to a method of manufacturing the semiconductor device.

2. Description of the Related Art

FIG. 4 is a cross-section illustrating an example of a conventional MOS transistor having a high withstanding voltage and a high driving performance. A semiconductor device 200 illustrated in FIG. 4 includes a semiconductor substrate 1, a first conductivity type well region 2, a second conductivity type low concentration drain region 3, a second conductivity type high concentration source region 4, a second conductivity type high concentration drain region 5, a gate oxide film 6, a channel formation region 7, a polycrystalline silicon gate electrode 8, a field oxide film 9, a protective oxide film 16, a source electrode 10, and a drain electrode 11. A feature of this structure resides in that the second conductivity type low concentration drain region 3 is formed between the channel formation region 7 and the second conductivity type high concentration drain region 5 to thereby attain high withstanding voltage while the channel formation region 7 and the second conductivity type high concentration source region 4 are brought into direct contact with each other to thereby attain high driving performance.

In the case of employing the structure described above, ion implantation for forming the second conductivity type high concentration source region 4 and the second conductivity type high concentration drain region 5 is performed over the gate oxide film 6 with the polycrystalline silicon gate electrode 8 being used as a mask. Here, in order to attain not only high source-drain withstanding voltage but also high gate-source withstanding voltage, it is necessary to increase a thickness of the gate oxide film 6, which may cause a problem that stable ion implantation for forming the second conductivity type high concentration source region 4 and the second conductivity type high concentration drain region 5 cannot be performed depending on kinds of impurities to be used and capability of an ion implantation apparatus. In view of the problem, there is known a method of removing the gate oxide film 6 through etching after the polycrystalline silicon gate electrode 8 has been formed before ion implantation for forming the second conductivity type high concentration source region 4 and the second conductivity type high concentration drain region 5 is performed. However, a source-side region 12 of the gate oxide film 6 is also side-etched during the etching, resulting in a structure having a region in which a part of the gate oxide film 6 located below the polycrystalline silicon gate electrode 8 is removed, as a semiconductor device 201 illustrated in FIG. 5. As in the case of the semiconductor device 201, if the gate oxide film 6 formed on the channel formation region 7 is removed even partially so that the protective oxide film 16 occupies the side-etched portion, performance of the semiconductor device is significantly deteriorated. Accordingly, an upper limit is placed on the thickness of the gate oxide film 6 with which the structure of the semiconductor device 200 may be obtained. To eliminate the upper limit, there has been proposed a method in which a source field oxide film is formed also on a source side of the channel formation region, and an impurity concentration of a field region below the source field oxide film is set higher than an impurity concentration of the second conductivity type low concentration drain region 3 (see, for example, JP 2002-208694 A).

With the method described above, a high driving performance may be attained even in a MOS transistor using a thick gate oxide film for a high withstanding voltage. However, because the impurity implantation into the region below the source field oxide film is performed before the formation of the field oxide film, a problem arises in which the film quality thereof deteriorates if the impurity concentration of the region below the source field oxide film becomes too high, also causing deterioration of characteristics of the transistor.

SUMMARY OF THE INVENTION

According to the present invention, a source field oxide film is formed also on a source side of a channel formation region, a length of the source field oxide film and an overlap amount of a polycrystalline silicon gate electrode and the source field oxide film are optimized, and a second conductivity type high concentration source field region is formed below the source field oxide film. Therefore, even if a gate oxide film is removed through etching before ion implantation for forming a second conductivity type high concentration source region and a second conductivity type high concentration drain region is performed and after the polycrystalline silicon gate electrode has been formed, the gate oxide film formed on the channel formation region is not etched. Accordingly, even in a case of using a thick gate oxide film, it is possible to obtain a MOS transistor having satisfactory characteristics and a high driving performance.

Employing the present invention enables obtaining a MOS transistor having a high driving performance and a high withstanding voltage in which a high source-gate withstanding voltage is also attained with a thick oxide film.

DETAILED DESCRIPTION OF THE INVENTION

Referring to the attached drawings, preferred embodiments for the present invention are described below.

Figure 1:
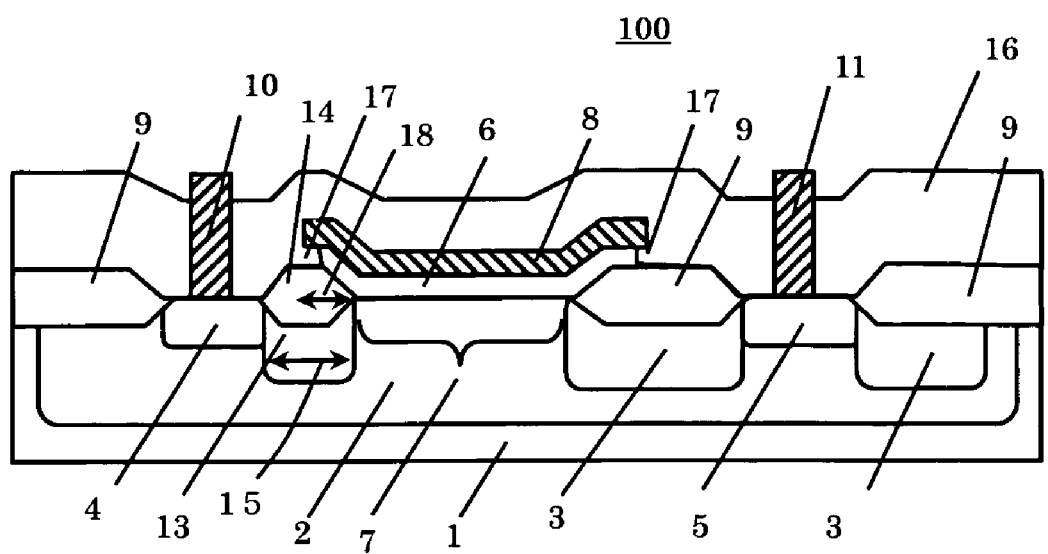
FIG. 1 illustrates a cross-section of a semiconductor device according to a first embodiment of the present invention.

FIG. 1 illustrates a cross-section of a semiconductor device 100 according to a first embodiment of the present invention. The semiconductor device 100 is a metal oxide semiconductor (MOS) field effect transistor which includes a semiconductor substrate 1, a first conductivity type well region 2, a second conductivity type high concentration source region 4, a second conductivity type high concentration drain region 5, second conductivity type low concentration drain regions 3, a second conductivity type high concentration source field region 13, a field oxide film 9, a source field oxide film 14, a gate oxide film 6, a polycrystalline silicon gate electrode 8, a protective oxide film 16, a source electrode 10, and a drain electrode 11.

The first conductivity type well region 2 is formed on a surface of the semiconductor substrate 1. The second conductivity type high concentration source region 4 and the second conductivity type high concentration drain region 5 are formed on a surface of the first conductivity type well region 2 so as to be spaced from each other with a channel formation region 7 being interposed therebetween. Each of the second conductivity type high concentration source region 4 and the second conductivity type high concentration drain region 5 has a conductivity type opposite to a conductivity type of the first conductivity type well region 2, and has an impurity concentration higher than an impurity concentration of the first conductivity type well region 2.

The second conductivity type low concentration drain regions 3 are formed so as to surround the second conductivity type high concentration drain region 5 and to be brought into contact with the channel formation region 7. The second conductivity type low concentration drain regions 3 have an impurity concentration lower than the impurity concentration of the second conductivity type high concentration drain region 5.

The second conductivity type high concentration source field region 13 is formed between the second conductivity type high concentration source region 4 and the channel formation region 7 so as to be brought into contact with the second conductivity type high concentration source region 4 and the channel formation region 7. The second conductivity type high concentration source field region 13 has an impurity concentration higher than the impurity concentration of the second conductivity type low concentration drain region 3 and equal to or lower than the impurity concentration of the second conductivity type high concentration drain region 5. The field oxide film 9 and the source field oxide film 14 are formed over the surface of the semiconductor substrate 1 in regions excluding the second conductivity type high concentration source region 4, the second conductivity type high concentration drain region 5, and the channel formation region 7.

The gate oxide film 6 is formed over the surface of the semiconductor substrate 1 located on the channel formation region 7 so as to partially overlap with the field oxide film 9 and the source field oxide film 14 which are formed on both sides of the channel formation region 7. The polycrystalline silicon gate electrode is formed on the gate oxide film 6 and side-etched portions 17 formed at both ends of the gate oxide film 6. The protective oxide film 16 is formed so as to cover the surface of the structural components. The source electrode 10 is formed so as to be brought into contact with the surface of the semiconductor substrate 1 located on the second conductivity type high concentration source region 4. The drain electrode 11 is formed so as to be brought into contact with the second conductivity type high concentration drain region 5.

Hereinafter, a method of manufacturing the semiconductor device 100 according to the first embodiment of the present invention is described with reference to FIGS. 2A to 2D.

The first conductivity type well region 2 is formed on the semiconductor substrate 1 through ion implantation or impurity thermal diffusion at an impurity concentration of from $1.0 \times 10^{16}$ cm$^{3}$ to $1.0 \times 10^{17}$ cm$^{-3}$. Further, a region which is to become the second conductivity type low concentration drain region 3 and a region which is to become the second conductivity type high concentration source field region 13 are formed through ion implantation or impurity thermal diffusion at impurity concentrations of from $1.0 \times 10^{17}$ cm$^{-3}$ to $1.0 \times 10^{19}$ cm$^{-3}$ and from $1.0 \times 10^{18}$ cm$^{-3}$ to $1.0 \times 10^{20}$ cm$^{-3}$, respectively. A length 15 of the second conductivity type high concentration source field region 13, which is parallel to a channel direction, is set to a sum of an etching amount required for etching the gate oxide film 6 (corresponding to twice the film thickness of the gate oxide film 6 with an over-etched amount thereof being set to 100%) and a manufacturing margin required for forming the polycrystalline silicon gate electrode 8 (corresponding to twice a mask alignment offset amount of the polycrystalline silicon gate electrode 8 and the source field oxide film 14 during a photolithography process).

The length 15 corresponds to a minimum distance required in order to form no side-etched portion 17 above the channel formation region 7 and prevent the polycrystalline silicon gate electrode 8 from extending to be formed onto the second conductivity type high concentration source region 4 during a process of removing the gate oxide film 6 through etching, which is described later.

Figure 2A:
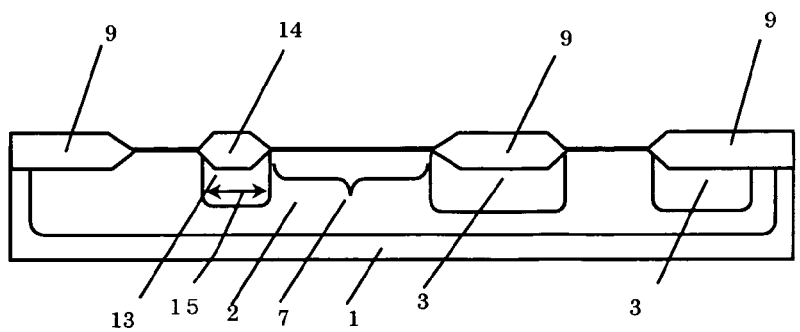
FIGS. 2A to 2D each schematically illustrate a cross-section of the semiconductor device according to the first embodiment of the present invention.

FIG. 2A illustrates a state in which the field oxide film 9 and the source field oxide film 14 are simultaneously formed at a film thickness of 8,000 Å through selective oxidation. The gate oxide film 6 is formed at a film thickness of from approximately 500 Å to 1,200 Å through thermal oxidation such as wet oxidation or dry oxidation. Then, polycrystalline silicon having a thickness of 4,000 Å is deposited on the gate oxide film 6 using chemical vapor deposition (CVD), and impurities are introduced into the polycrystalline silicon through thermal diffusion or ion implantation.

Figure 2B:
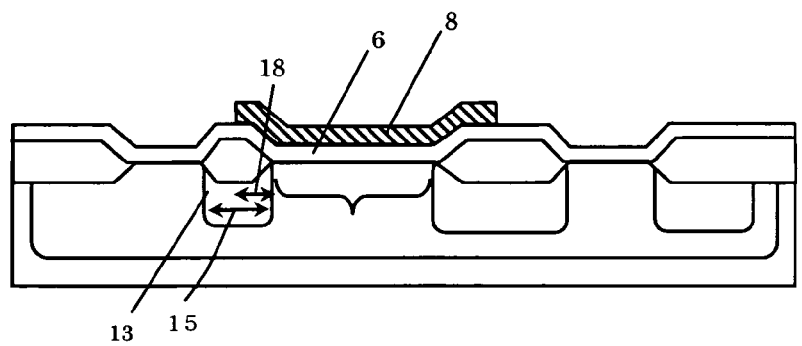

Subsequently, using photolithography, a resist mask is formed so that an overlap amount 18 of the source-side polycrystalline silicon gate electrode 8 and the source field oxide film 14 corresponds to a sum of the etching amount required for etching the gate oxide film 6 (corresponding to twice the film thickness of the gate oxide film 6 with the over-etched amount thereof being set to 100%) and a manufacturing margin (corresponding to the mask alignment offset amount of the polycrystalline silicon gate electrode 8 and the source field oxide film 14 during the photolithography process). FIG. 2B illustrates a state in which the polycrystalline silicon excluding a target region of the polycrystalline silicon gate electrode 8 is removed through dry etching.

If the length 15 of the second conductivity type high concentration source field region 13 and the overlap amount 18 are set as described above, the second conductivity type high concentration source field region 13 may be formed with a minimum dimension which can prevent the formation of the side-etched portion 17 above the channel formation region 7 and the invasion of the protective oxide film 16 into the side-etched portion 17 to thereby deteriorate characteristics of the semiconductor device, and the formation of the source-side polycrystalline silicon gate electrode 8 on the second conductivity type high concentration source region 4 to thereby hinder the introduction of the impurities during the formation of the second conductivity type high concentration source region 4, which is described later. When the dimension of the second conductivity type high concentration source field region 13 is minimized, an increase in resistance of a source region may be suppressed, which makes it possible to impart high driving performance to the semiconductor device 100.

Figure 2C:
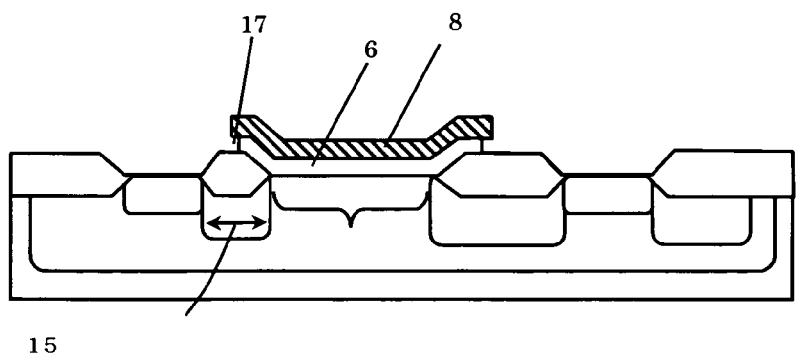

FIG. 2C illustrates a state in which the gate oxide film 6 is removed through dry etching or wet etching with the polycrystalline silicon gate electrode 8 being used as a mask, and the second conductivity type high concentration source region 4 and the second conductivity type high concentration drain region 5 are formed through ion implantation or impurity thermal diffusion at an impurity concentration of from $1.0 \times 10^{18}$ cm$^{-3}$ to $1.0 \times 10^{20}$ cm$^{-3}$.

Figure 2D:
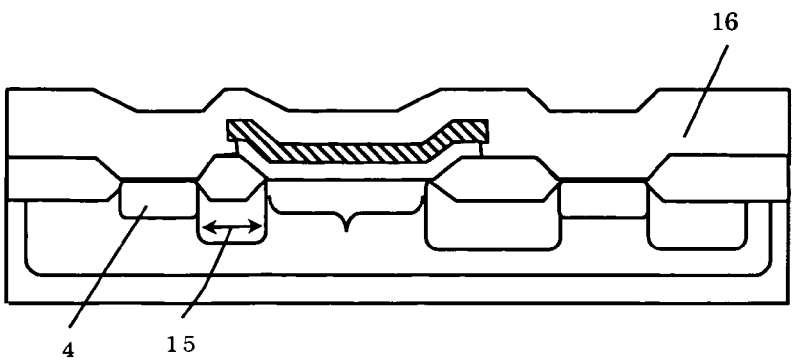

FIG. 2D illustrates a state in which the protective oxide film 16 is formed using any one of a nondoped silicate glass (NSG) film, a phosphosilicate glass (PSG) film, a borophosphosilicate glass (BPSG) film, and a tetraethylorthosilicate (TEOS) film, or a lamination thereof through plasma CVD or low-pressure CVD (LP-CVD). Through dry etching or a combination of wet etching and dry etching, target regions of the protective oxide film 16 located above the second conductivity type high concentration source region 4 and the second conductivity type high concentration drain region 5 are removed, and then the source electrode 10 and the drain electrode 11 are formed.

Note that in the above description, the over-etched amount at the time of removing the gate oxide film through etching is set to 100%, but it is needless to say that the over-etched amount may be set to a value less than 100%.

Figure 3:
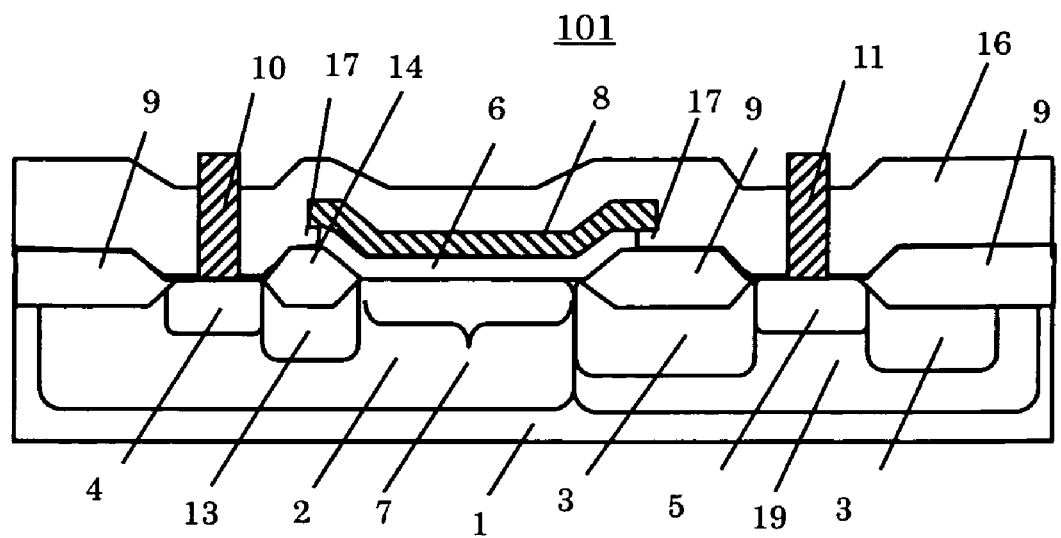
FIG. 3 illustrates a cross-section of a semiconductor device according to a second embodiment of the present invention.
Figure 4:
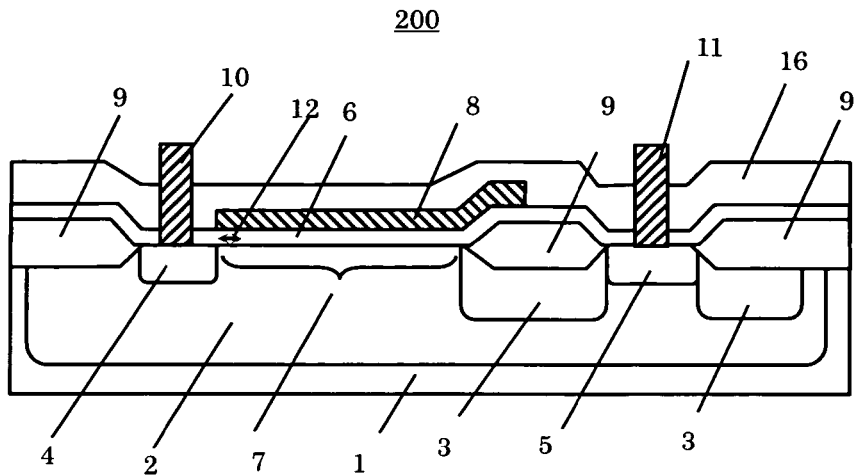
FIG. 4 illustrates a cross-section of a semiconductor device according to an embodiment of the related art.
Figure 5:
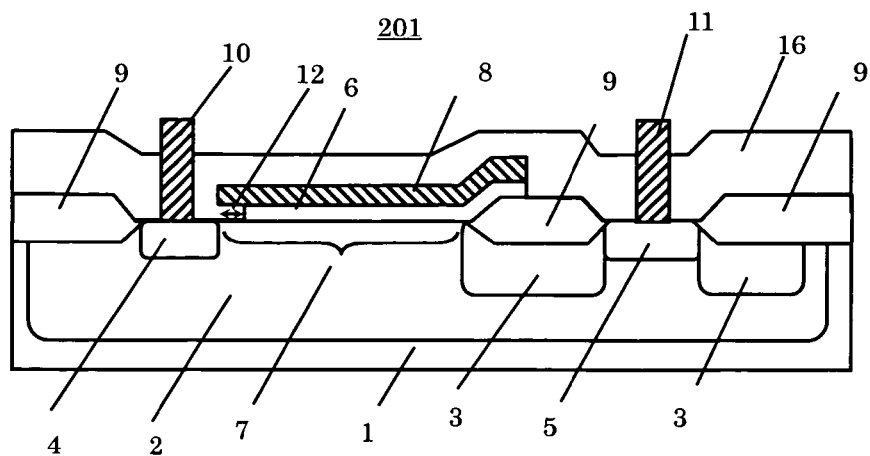
FIG. 5 illustrates a cross-section of a semiconductor device according to an embodiment of the related art.

FIG. 3 illustrates a cross-section of a semiconductor device 101 according to a second embodiment of the present invention. The semiconductor device 101 is a MOS field effect transistor which includes a semiconductor substrate 1, a first conductivity type well region 2, a second conductivity type well region 19, a second conductivity type high concentration source region 4, a second conductivity type high concentration drain region 5, second conductivity type low concentration drain regions 3, a second conductivity type high concentration source field region 13, a field oxide film 9, a source field oxide film 14, a gate oxide film 6, a polycrystalline silicon gate electrode 8, a protective oxide film 16, a source electrode 10, and a drain electrode 11.

The first conductivity type well region 2 is formed on a surface of the semiconductor substrate 1. The second conductivity type well region 19 is formed below the second conductivity type high concentration drain region 5 so as to be brought into contact with the first conductivity type well region 2. The second conductivity type well region 19 has a conductivity type opposite to a conductivity type of the first conductivity type well region 2. The second conductivity type high concentration source region 4 and the second conductivity type high concentration drain region 5 are formed on a surface of the first conductivity type well region 2 so as to be spaced from each other with a channel formation region 7 being interposed therebetween.

Each of the second conductivity type high concentration source region 4 and the second conductivity type high concentration drain region 5 has an impurity concentration higher than an impurity concentration of the second conductivity type well region 19. The second conductivity type low concentration drain regions 3 are formed so as to surround the second conductivity type high concentration drain region 5 and to be brought into contact with the channel formation region 7. The second conductivity type low concentration drain regions 3 have an impurity concentration lower than the impurity concentration of the second conductivity type high concentration drain region 5. The second conductivity type high concentration source field region 13 is formed between the second conductivity type high concentration source region 4 and the channel formation region 7 so as to be brought into contact with the second conductivity type high concentration source region 4 and the channel formation region 7. The second conductivity type high concentration source field region 13 has an impurity concentration higher than the impurity concentration of the second conductivity type low concentration drain region 3 and equal to or lower than the impurity concentration of the second conductivity type high concentration drain region 5.

The field oxide film 9 and the source field oxide film 14 are formed over the surface of the semiconductor substrate 1 in regions excluding the second conductivity type high concentration source region 4, the second conductivity type high concentration drain region 5, and the channel formation region 7. The gate oxide film 6 is formed over the surface of the semiconductor substrate 1 located on the channel formation region 7 so as to partially overlap with the field oxide film 9 and the source field oxide film 14 which are formed on both sides of the channel formation region 7. The polycrystalline silicon gate electrode 8 is formed on the gate oxide film 6 and side-etched portions 17 formed at both ends of the gate oxide film 6. The protective oxide film 16 is formed so as to cover the surface of the structural components. The source electrode 10 is formed so as to be brought into contact with the surface of the semiconductor substrate 1 located on the second conductivity type high concentration source region 4. The drain electrode 11 is formed so as to be brought into contact with the second conductivity type high concentration drain region 5.

According to the structure of the semiconductor device 101, the second conductivity type well region 19 is formed below the second conductivity type high concentration drain region 5. Therefore, it becomes possible to manufacture a semiconductor device having higher withstanding voltage as compared to the case of the structure of the semiconductor device 100.

What is claimed is:
1. A semiconductor device, comprising:
a semiconductor substrate;
a first conductivity type well region disposed on the semiconductor substrate;
a second conductivity type high concentration source region and a second conductivity type high concentration drain region each disposed on a surface of the first conductivity type well region so as to be spaced from each other with a channel formation region interposing therebetween, the second conductivity type high concentration source region and the second conductivity type high concentration drain region each having a conductivity type opposite to a conductivity type of the first conductivity type well region, and having an impurity concentration higher than an impurity concentration of the first conductivity type well region;
a second conductivity type low concentration drain region disposed to surround the second conductivity type high concentration drain region and to be brought into contact with the channel formation region;
a second conductivity type high concentration source field region disposed between the second conductivity type high concentration source region and the channel formation region so as to be brought into contact with the second conductivity type high concentration source region and the channel formation region;
a field oxide film and a source field oxide film disposed over a surface of the semiconductor substrate in regions excluding the second conductivity type high concentration source region, the second conductivity type high concentration drain region, and the channel formation region;
a gate oxide film disposed over the surface of the semiconductor substrate, and located on the channel formation region so as to partially overlap with the field oxide film and the source field oxide film formed on both sides of the channel formation region;

a polycrystalline silicon gate electrode disposed on both the gate oxide film and side-etched portions located at both ends of the gate oxide film;

a protective oxide film disposed to cover structural components formed on the semiconductor substrate;

a source electrode which is formed so as to be brought into contact with the second conductivity type high concentration source region; and a drain electrode which is formed so as to be brought into contact with the second conductivity type high concentration drain region, wherein the second conductivity type high concentration source field region has a length in parallel to a channel direction being equal to or larger than a sum of twice a mask alignment offset amount of the polycrystalline silicon gate electrode and the source field oxide film and twice a film thickness of the gate oxide film.

2. A semiconductor device according to claim 1, further comprising a second conductivity type well region which is formed around and below the second conductivity type high concentration drain region and the second conductivity type low concentration drain regions so as to extend from the surface of the semiconductor substrate into an inside of the semiconductor substrate to be brought into contact with the first conductivity type well region, the second conductivity type well region having a conductivity type opposite to the conductivity type of the first conductivity type well region.

3. A semiconductor device according to claim 1, wherein the second conductivity type high concentration source field region has an impurity concentration of from $1.0 \times 10^{18}$ cm$^{-3}$ to $1.0 \times 10^{20}$ cm$^{-3}$.

* * * * *